United States Patent [19]

Kienberger et al.

[11] 4,201,956

[45] May 6, 1980

[54] ARRANGEMENT FOR THE GENERATION AND RADIATION OF MICROWAVES

[75] Inventors: Karl-Heinz Kienberger, Schopfheim-Wiechs; Don J. R. Stock, Schopfheim-Langenau, both of Fed. Rep. of Germany

[73] Assignee: Endress u. Hauser GmbH u. Co., Maulburg, Fed. Rep. of Germany

[21] Appl. No.: 946,368

[22] Filed: Sep. 27, 1978

[30] Foreign Application Priority Data

Oct. 5, 1977 [DE] Fed. Rep. of Germany ....... 2744883

[51] Int. Cl.² .................. H01Q 13/02; H03B 5/18; H03B 9/12
[52] U.S. Cl. .................. 331/96; 331/107 DP; 331/107 G; 333/212; 343/783; 343/786; 455/129
[58] Field of Search ................ 331/96–98, 331/107 DP, 107 G; 343/783, 786, 772, 860–863; 325/178, 179; 333/208, 209, 212

[56] References Cited

U.S. PATENT DOCUMENTS

| 2,461,005 | 2/1949 | Southworth | 331/96 X |
|---|---|---|---|
| 3,413,642 | 11/1968 | Cook | 343/783 X |
| 3,510,800 | 5/1970 | Kaneko et al. | 331/96 |
| 3,524,186 | 8/1970 | Fleri et al. | 343/854 X |
| 3,593,192 | 7/1971 | Nagano et al. | 331/107 DP X |
| 3,611,374 | 10/1971 | Draysey | 331/107 G X |

FOREIGN PATENT DOCUMENTS 456879 4/1950 Italy ................................. 331/90

OTHER PUBLICATIONS

Walmore Electronics Ltd., "Short-Range Doppler Radar Using Baritt Diode," Electronic Engineering, Aug. 1974, p. 11.

Primary Examiner—Siegfried H. Grimm
Attorney, Agent, or Firm—Gerald J. Ferguson, Jr.; Joseph J. Baker

[57] ABSTRACT

Apparatus for the generation and radiation of microwave radiation including a microwave oscillator having a cavity resonator directly coupled with the input of a horn resonator by way of a first apertured diaphragm. There is arranged within the horn radiator a second apertured diaphragm disposed at a distance from the first apertured diaphragm such that together with the first diaphragm it forms a filter resonator.

4 Claims, 2 Drawing Figures

ARRANGEMENT FOR THE GENERATION AND RADIATION OF MICROWAVES

This invention relates to an arrangement for the generation and radiation of microwave radiation, including a microwave oscillator having a cavity resonator which is coupled through an apertured diaphragm directly with the input of a horn radiator.

Such an arrangement provides the advantage of a very compact construction of small overall length, which is necessary in many applications. There exists, however, the problem of radiation of unwanted frequencies, since the filtering effect of the apertured diaphragm is not sufficiently selective. For microwave oscillators, particularly Gunn diode oscillators, which are constructed within a cavity resonator, there exists a preferred solution of this problem in the inclusion of a band-pass filter, that is likewise constructed within the cavity resonator itself. The introduction of such a cavity resonator filter would however increase the overall length in an undersirable manner and for many purposes would also be too complicated and too expensive.

The object of the invention is to provide an arrangement of the kind initially described, in which the radiation of undesired frequencies is prevented without increasing the overall length and at low cost.

According to the invention this object is achieved in that there is arranged in the horn radiator a second apertured diaphragm, at a distance from the first apertured diaphragm such that together with the first apertured diaphragm it forms a filter resonator.

The invention makes it possible to include a band-pass filter with good flank steepness in a microwave oscillator coupled with a horn radiator, without the introduction of additional components between the oscillator and the input of the horn radiator, since the filter is constructed within the transition region of the horn radiator itself. The cost is very small, since practically only an additional apertured diaphragm and in case of need the necessary tuning means in the horn radiator need to be added.

The invention is particularly suitable in the case where the microwave oscillator is a Gunn diode oscillator.

Further features and advantages of the invention may be appreciated from the following description of embodiments, given with reference to the accompanying drawings, in which.

Figure 1:
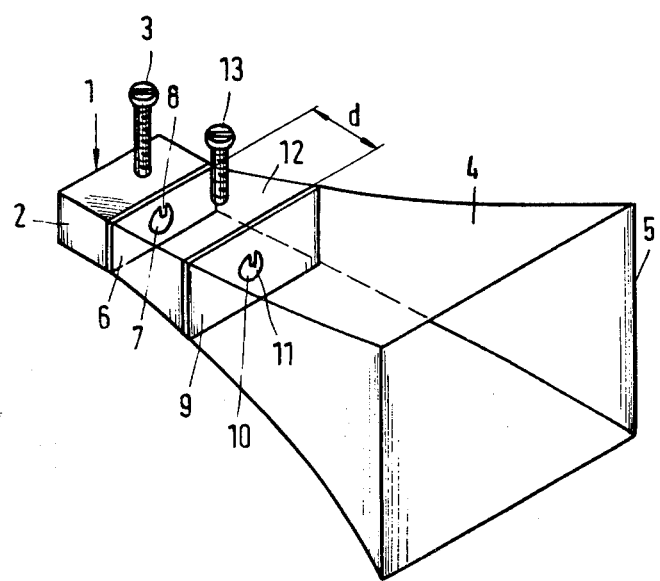
FIG. 1 is a schematic perspective view of one embodiment of the invention.

FIG. 1 shows a microwave oscillator 1, which is equipped, for example, with a Gunn diode and which is arranged within a rectangular cavity resonator 2. The cavity resonator 2 is in known manner provided with a tuning screw 3. A horn radiator 4 is fitted directly to the microwave oscillator 1. The radiator 4 expands exponentially from the rectangular cross-section of the cavity resonator 2 to its mouth 5.

At the junction plane between the microwave oscillator 1 and the horn radiator 4 is arranged an apertured diaphragm 6, of which the aperture 7 serves as a coupling aperture between the microwave oscillator and the horn radiator. The apertured diaphragm is constructed with a tuning flag 8 extending into the aperture 7; the diameter of the aperture 7 and the dimensions of the tuning flag 8 are experimentally tuned to the frequency of the oscillator oscillation which is to be coupled.

At a distance d from the apertured diaphragm 6 there is arranged a second apertured diaphragm 9, which likewise include an aperture 10 into which extends a tuning flag 11. The distance d is made such that the two apertured diaphragms form a resonant filter, of which the resonance coupling elements are formed by the two apertured diaphragms. The filter resonator 12 formed between the apertured diaphragms 6 and 9 is provided with a further capacitive tuning screw 13. The two tuning screws 3 and 13 serve as filter tuning screws, with which the desired band-pass frequency may be adjusted.

Figure 2:
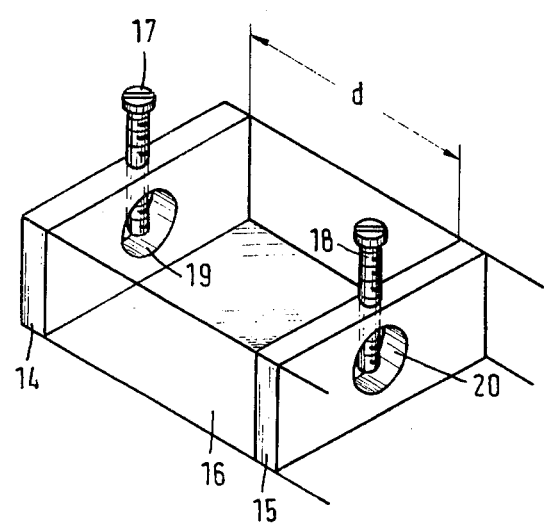
FIG. 2 is a perspective partial view of a modified form of the arrangement according to the invention.

FIG. 2 shows a modified embodiment with two apertured diaphragms 14 and 15, which correspond to the apertured diaphragms 6 and 9 respectively of FIG. 1. The apertured diaphragms 14 and 15 are again arranged at a distance d and serve as resonance coupling elements for the filter resonator 16, which is formed between them. In this embodiment there are provided in place of the tuning flags tuning screws 17 and 18 which for tuning purposes can be screwed into the diaphragm apertures 19 and 20 respectively. The tuning screws 3 and 13 of FIG. 1 are absent.

In the two forms of embodiment described above a selective filter is formed by making use of the initial region of the horn radiator 4, in which the horn radiator still has a form which approximates to the form of a waveguide. A good filtering action is thus obtained at low cost and with very short overall length.

What we claim is:

1. An arrangement for the generation and radiation of microwave radiation, including a microwave oscillator having a cavity resonator directly coupled with the input of a horn radiator by way of an apertured diaphragm, the cross-section of the horn radiator expanding in size from said input thereof to the output thereof and wherein there is arranged within the expanding horn radiator a second apertured diaphragm disposed at a distance from the first said apertured diaphragm such that together with the first said apertured diaphragm it forms a filter resonator for frequency filtering the oscillator output as it is fed to the horn radiator, the first apertured diaphragm being common to the oscillator cavity and to the filter resonator cavity.

2. An arrangement in accordance with claim 1, wherein a tuning screw is provided for each of the oscillator resonator and the filter resonator.

3. An arrangement in accordance with claim 1 or 2 wherein an adjustable tuning member is provided at each diaphragm aperture.

4. An arrangement in accordance with any one of claims 1 to 3, wherein the microwave oscillator is a Gunn diode oscillator.

* * * * *